United States Patent [19]
Valdez

[11] Patent Number: 4,586,004
[45] Date of Patent: Apr. 29, 1986

[54] LOGIC AND AMPLIFIER CELLS

[75] Inventor: Frank A. Valdez, San Mateo, Calif.

[73] Assignee: Saber Technology Corp., San Jose, Calif.

[21] Appl. No.: 508,310

[22] Filed: Jun. 27, 1983

[51] Int. Cl.$^4$ ............................................. H03F 3/16
[52] U.S. Cl. .................................... 330/300; 330/311
[58] Field of Search ............... 330/277, 296, 300, 311; 307/495

[56] References Cited
U.S. PATENT DOCUMENTS
4,214,215  7/1980  Mellen et al. ....................... 330/277

Primary Examiner—James B. Mullins
Assistant Examiner—G. Wan
Attorney, Agent, or Firm—Fliesler, Dubb, Meyer & Lovejoy

[57] ABSTRACT

Disclosed is a high-speed circuit in which a basic cell includes a high-speed first transistor and a high-speed second transistor. Both the first and second transistors have high gain-bandwidth products. The second transistor is a unipolar (field-effect) device which is connected in a cascode configuration with the first transistor. The unipolar device functions to control the operating point of the first transistor over a range from "on" to "off" as a function of the unipolar device operating at a point over the range from "on" to "off". The unipolar device is controlled by an input voltage signal applied to its gate.

20 Claims, 8 Drawing Figures

LOGIC AND AMPLIFIER CELLS

BACKGROUND OF THE INVENTION

The present invention relates to electrical circuits capable of high-speed operation. More specifically, the present invention relates to semiconductor electrical circuits which are useful both as logic cells and as amplifiers.

In the prior art, semiconductor devices have been classified in two general categories, namely, unipolar devices (usually called field-effect devices) and bipolar devices. Such unipolar and bipolar devices have been used for logic cells and for linear amplifiers in many different circuit configurations.

Logic cells are circuits which operate in two different states and hence are bistable devices. Logic cells have found wide application in the storage of digital information such as used in computers and other data processing equipment. The speed with which bistable devices can be switched from one stable state to the other stable state is important since data processing equipment requires higher and higher speeds of operation.

Also, the density of logic cells, that is the number of logic cells per square area, is another important consideration since data processing equipment requires larger and larger numbers of cells. Also, the closeness of logic cells has a significant impact on the speed at which information can be transferred from cell to cell. The power consumption of logic cells is an additional important factor since excessive heat build-up resulting from high power consumption will destroy the logic cells.

Amplifiers operate over a linear range to amplify by a factor K an input signal, $V_{in}$, to produce an output signal, $V_{out}$. The magnitude of the amplification factor K is one important characteristic of linear amplifiers. Also, the bandwidth of the amplifier is an important consideration. Also, the maximum voltage, called the voltage breakdown, which the amplifier has is an important consideration for those applications, such as driving a CRT which require high voltage levels.

For input signals which are operating at very high frequencies and over large frequency bandwidths, amplifier circuits have design considerations similar to those of logic cells.

Logic Cells

Prior art logic cells have employed many different types of unipolar and bipolar circuits. For high frequency operation, prior art logic cells typically have employed both saturated and non-saturated common-emitter bipolar transistor circuits. Common-emitter circuits, although very fast, have Miller-effect capacitances which tend to result in slower speeds of operation. When common-emitter circuits are operated in a saturated mode, the storage time, the time required to switch out of saturation, also reduces the overall switching speed. Schottky non-saturated logic cells were devised to reduce the storage time of the saturated common-emitter configuration. However, the delay time caused by the Miller-effect capacitance is a persistent problem even in Schottky devices. The delay time resulting from the Miller effect is proportional to the product of the load resistance and the Miller-effect capacitance.

Emitter-coupled-logic (ECL) cells are well-known cells devised for high-speed operation. The ECL cell reduces the problems of storage time and of Miller-effect capacitance but at the expense of greater power consumption. The ECL cell is a differential pair of high-frequency transistors in a common-emitter configuration operated in the linear mode to avoid storage times and with low resistance value collector transistors (or resistors) to minimize the delays caused by the Miller-effect capacitance. Because of the linear operation, that is the transistors do not enter saturation, the storage time of the ECL cell is low or non-existent.

A frequency response analysis for a conventional ECL cell connected in a common-emitter mode based upon a hybrid equivalent circuit is given as follows:

$$\omega_b/D = [\omega_t/\beta]/[1 + \omega_t/\omega_c] \qquad \text{Eq. (1)}$$

where, $\omega_b/D = -3$ db high frequency point
$\omega_t =$ Gain-bandwidth product (in radians)
$\omega_c =$ Frequency limitation of the Miller-effect capacitance (in radians)
$\beta =$ Transistor low frequency gain $$\omega_c = 1/[R_L C_C] \qquad \text{Eq. (2)}$$

where, $C_C =$ Transistor output capacitance
$R_L =$ Load resistor value $$\omega_t = 2\pi F_t \qquad \text{Eq. (3)}$$

where, $F_t =$ Gain-bandwidth-product (cycles per second)
Typical values for ECL 100K logic cells are as follows:
$F_t = 5$ GHz
$C_C = 0.55$ pf
$R_L = 100$ ohms
$\beta = 20$
Rewriting Eq. (1) produces the following equation:

$$\omega_b/D = \omega_t/[\beta(1 + C_C R_L \omega_t)] \qquad \text{Eq. (4)}$$

Substituting the above typical values into Eq. (4) yields a $-3$ db high frequency point as follows:

$$\omega_b/D = [\pi(5 \times 10^9)]/[20(1 + (0.5 \times 10^{-12})(100)(\pi)(5 \times 10^9))]$$
$$= [2.5/1.25] \times 10^8$$
$$= 200 \text{ Mhz}$$

Using the expression which relates bandwidth and risetime, we can write:

$$\begin{aligned}\text{Risetime} = RT &= 0.35/\text{Bandwidth} \\ &= 0.35/[\omega_b/D] \\ &= 0.35/[200 \times 10^6] \\ &= 0.35/[200 \times 10^6]\end{aligned} \qquad \text{Eq. (5)}$$

Risetime = 1.8 nanoseconds.

The above analysis yields a 1.8 nanoseconds risetime which is very close to the 1.5 nanoseconds (typical) risetime of ECL 100K logic cells which are commonly available from manufacturers.

From the above analysis, it is apparent that the gain-bandwidth product has a significant effect on the highest frequency of operation, $\omega_b/D$. The greater the gain-bandwidth product, the higher the highest frequency of operation. However, the greater the gain, $\beta$, the lower the highest frequency of operation. This relationship results because of the Miller-effect which effectively multiplies the $R_L C_C$ term in the denominator of Eq. (4) by the gain, $\beta$.

Typical values for the collector resistors for ECL logic cells are 50 to 100 ohms. In order to obtain a logic level swing of 1 volt peak-to-peak a collector current of 20 milliamperes is typical for the 50 ohm case. Since two transistors are employed for the differential logic gate, 20 milliamperes are typical for an ECL logic gate. The typical power supply voltage is 5.0 volts for a total power consumption of 100 milliwatts per gate. This level of power consumption per gate has precluded the use of ECL cells in very-large-scale-integration (VLSI) densities that are readily achievable with MOS and other unipolar technologies. For example, if a 4000 gate array is constructed using typical ECL cells, a typical array would consume 400 watts of power. Such power consumption is excessive.

Generally, there are two approaches to reducing the power consumption in high density ECL logic cells. One approach reduces the DC bias voltage used to operated the cell. Reducing the bias voltage generally descreases the switching speed. While power consumption is reduced, the switching speed is correspondingly reduced.

A second approach for reducing the power consumption is achieved by increasing the collector resistance values in the ECL logic cell. If the collector resistance values are increased, however, the adverse consequences of the Miller-effect capacitance are also increased. Therefore, a reduction in power consumption is accompanied by a reduction in the frequency performance of the ECL logic cell.

The power consumption and the frequency performance are directly related in an ECL cell. If power consumption is increased (load resistance is increased) then the frequency of operation is increased and vice versa. There is a power/frequency tradeoff in ECL cells. Design techniques which are effective in reducing the power consumption can be employed to provide an increase in frequency performance relative to the same power consumption. While the power/frequency tradeoff is well known, satisfactory levels of power/frequency performance have not been achieved particularly for high densities of logic cells.

Accordingly, there is a need for an improved logic cell which has an improved power/frequency performance without decreased noise immunity or temperature stability.

Amplifiers

The amplification of signals is performed using many different bipolar and unipolar circuit configurations. Video signal amplifiers, in particular, have demanding design limitations because they require high speed, wide bandwidth and large breakdown voltage characteristics.

In the all bipolar approach for video amplifiers, a video cascode amplifier is widely in use. The cascode amplifier uses a common-emitter stage to drive a common-base stage. Since linear amplification is the primary function of a video amplifier, the devices are not permitted to go into saturation and, hence, storage time is not a consideration. The basic limitation of the bipolar video cascode is the restricted output voltage swing due to the low breakdown voltage capability of the high frequency bipolar transistors. Breakdown voltages are typically about 15 to 20 volts. In order to produce a voltage swing of 45 volts, for example, the required breakdown must be at least 50 to 60 volts.

To meet the 60 volt breakdown requirement using 15 volt bipolar devices, a high-voltage "stack" of bipolar devices has been used. The "stack" produces less than favorable results due to the increased capacitance encountered in the base basing circuit. The voltages at the base nodes of the devices in the stack each have an input capacitance. If a fast risetime signal is employed, the risetime will degrade progressively at each node in the stack. Therefore, although the desired high breakdown voltage is achieved, the frequency response is correspondingly reduced. Accordingly, the bipolar cascode video amplifier has not been entirely satisfactory for high frequency/high breakdown voltage applications.

In a typical all MOS video amplifier, a MOS transistor, which has a high breakdown voltage, is in source-to-drain series with a load resistor. The problem with such circuits is the frequency limitation due to the large output capacitance usually found in high-breakdown MOS transistors (typically 15 to 30 picofarads). When the output capacitance of the MOS devices is multiplied times the load resistance, a very slow risetime is encountered resulting in a poor frequency response. Accordingly, prior art unipolar video amplifiers have not been entirely satisfactory for high frequency applications.

Neither the all bipolar nor the all unipolar circuits have proved satisfactory. Although combinations of bipolar and unipolar devices have been proposed, the proposals heretofore have been for limited uses. One such circuit, called a BI-MOS circuit, has been proposed. The BI-MOS circuit is an AC operated circuit which heretofore has not been capable of wide-bandwidth operation. In a typical circuit, an inductive current transformer is connected in series with the series combination of the collector-emitter of a high-voltage bipolar device and the source-drain of an MOS device. The output from the current transformer drives the base of the high-voltage bipolar transistor. Unfortunately, the transformer of the circuit restricts operation to a narrow frequency band. The circuit cannot operate well at either high-frequency or at low frequency (DC).

In the operation of the BI-MOS circuit, a capacitor connected from the base of the bipolar device to the source of the MOS device is charged to the voltage of a parallel Zener diode when the BI-MOS switch is "off". When the MOS device is switched "on", a base drive current to the bipolar device is necessary to start the collector current and turn the bipolar device "on". The base drive current is initially derived from the capacitor. Once the collector current is established, the output from the current transformer supplies the drive current to the base of the bipolar device.

When the BI-MOS circuit is used in a horizontal deflection circuit of a cathode-ray tube (CRT), start-up problems have been encountered. In order to overcome the start-up problems, complex circuits have been found necessary to sequence the BI-MOS circuit. The prior art BI-MOS circuits have not proved satisfactory for high bandwidth operation (DC to high frequency) and high speed operation and furthermore they are unduly complex.

Power Amplifiers

In a conventional horizontal deflection circuit for a CRT monitor a high-voltage, high-current switching transistor is commonly employed. The conventional method for turning "on" and "off" such a transistor uses a transformer connected to drive the base. The device is driven entirely through the base and not through the emitter. This type of base-drive operation causes significant limitations on the switching speed and voltage breakdown of the transistor. In the base drive mode, the storage time for a typical high-power transistor is approximately 3 to 6 microseconds. High voltage transistors have long saturation times in the order of 5 to 10 microseconds, when driven in a conventional base-drive manner. Any power transistor has two parameters for voltage breakdown, $BV_{CBO}$, the collector-to-base breakdown voltage with the emitter open and $BV_{CEO}$, the collector-to-emitter breakdown with the base open. $BV_{CBO}$ is always the greater of the two. For one such device, the $BV_{CBO}$ is 1,700 volts, while the $BV_{CEO}$ is 800 volts. Driving such a device in the common-emitter mode causes long saturation times and limited breakdown capability. Therefore, the desired high performance switching for a high resolution monitor cannot be met with such devices operated in the normal, common emitter mode. For example, the flyback pulses generated with available deflection yoke inductances for a color CRT are in the range of 1,000 to 1,200 volts for a full-scan of 14.5 inches measured horizontally.

While many circuit arrangements, including those described above, have been employed to form high-frequency logic cells and/or high-frequency, high-bandwidth amplifiers, there is a need for improved devices capable of even greater speeds of operation and even greater bandwidths having acceptable levels of operating voltages, currents and power.

Accordingly, it is an objective of the present invention to provide improved circuits capable of higher speeds and higher bandwidths of operation with acceptable levels of voltage, current and power consumption both in logic cell and in amplifier cell applications.

SUMMARY OF THE INVENTION

The present invention is a high-speed circuit in which a basic cell includes a high-speed first transistor and a high-speed second transistor. Both the first and second transistors have high gain-bandwidth products. The second transistor is a unipolar (field-effect) device which is connected in a cascode configuration with the first transistor. The unipolar device functions to control the operating point of the first transistor over a range from "on" to "off" as a function of the unipolar device operating at a point over the range from "on" to "off". The unipolar device is controlled by an input voltage signal applied to its gate.

In a logic cell embodiment, a biasing network causes the high-speed first transistor to be forced into and out of saturation at high speeds. High speed is present because the switching signal occurs in the first transistor through the high-current, low-input-impedance terminal. The switching signal is driven by the second transistor. The high-current, low input impedance terminal is the source in a unipolar device and the emitter in a bipolar device.

In one embodiment of the present invention, the basic cell is constructed with the field-effect device being an MOS device and with the high-speed transistor being a bipolar device. The drain of the MOS device is connected to the emitter of the bipolar device. The bipolar device is switched into and out of saturation through the emitter by operation of the MOS device. The bipolar device is operated in common-base mode with the input through the emitter and the output through the collector. In the common-base mode, the Miller effect is not present and hence the collector capacitance is a low value. The low collector capacitance, for any given collector load resistance, produces a small time constant and hence permits a high frequency of operation.

In another embodiment, the basic cell is implemented as a linear amplifier. The biasing network on the high-speed transistor is selected to keep the transistor out of saturation. The switching signal to the high-speed transistor is input to the high-current, low input impedance terminal, that is for example, through the emitter in the case of a bipolar device and through the source in the case of a unipolar device. The transistor is selected to have a high frequency characteristic, that is a high gain-bandwidth product, which enables high frequency of operation. When a high-breakdown voltage is required for the basic cell, the unipolar device is selected with a high-breakdown voltage. In a typical application, the basic cell is used as a video amplifier where both high frequency of operation and high-breakdown voltage are required.

The basic cell of the present invention has many high performance embodiments which achieve the objective of providing improved circuits capable of high speed, high bandwidth, and high signal output operation and/or reduced power consumption.

The foregoing and other objects, features and advantages of the invention will be apparent from the following more particular description of preferred embodiments of the invention, as illustrated in the accompanying drawings.

DETAILED DESCRIPTION

Figure 1:
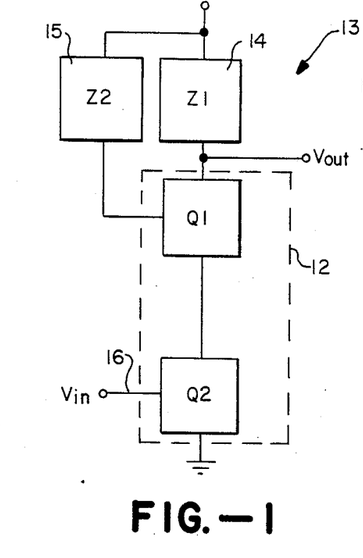
FIG. 1 depicts a basic cell in accordance with the present invention.

Basic Cell—FIG. 1

In FIG. 1, an electrical schematic diagram of the basic cell 13 is shown. Cell 13 is composed of four elements including element 12, including transistors Q1 and Q2, and two elements 14 and 15. The cell 13 receives the $V_{in}$ signal on line 16 and provides the $V_{out}$ signal on line 17. Q2 is typically a unipolar device, such as a metal-oxide-semiconductor (MOS) transistor, while Q1 is any high-speed device such as a bipolar or unipolar transistor.

One essential characteristic of the FIG. 1 cell is that a voltage controlled device Q2 is used to control the conduction of device Q1 by altering the current through the high-conduction path of Q1. If device Q1 is a bipolar device, Q1 is controlled to have an operating point in the range from "on" to "off". The control signal is supplied through the emitter of Q1 in a common-base mode of operation. If device Q1 is a unipolar device, Q1 is controlled through its source in a common-gate mode of operation.

In FIG. 1, the load 14 has an impedance, Z1, and the element 15 in some embodiments has an impedance, Z2. In such embodiments, Z2 has a value which is, in general, much less than Z1 so that the collector current for a bipolar device or the drain current for a unipolar device is much greater than the base or gate current, respectively. Taken together, elements 14 and 15 form a biasing circuit which controls the operating point of the transistor Q1. The output signal, $V_{out}$, is derived from a connection between the load element 14 and the transistor device Q1. The magnitude of $V_{out}$ is determined by the operating point of transistor Q1, that is, by the amount of current conducted by transistor Q1.

In FIG. 1, the transistor devices Q1 and Q2 are selected with different characteristics depending on the function to be performed by the FIG. 1 circuit.

For high-bandwidth operation, the transistor device Q1 is selected to have a high gain-bandwidth product, for example, greater than 2 GHz. For high breakdown voltage applications, such as in a video amplifier for a CRT, the transistor device Q2 is selected to have high voltage-breakdown properties.

For both the logic cell and the linear amplifier applications, both devices Q1 and Q2 are selected to have high gain-bandwidth products. In the logic cell applications, the high gain-bandwidth product is important to insure that low power consumption occurs for high switching speeds. In video amplifier applications, the high gain-bandwidth product is important to insure that the output signal range is amplified relative to the input signal range at high switching speeds.

For high power applications at relatively high switching speeds, the transistor Q1 is selected to provide high output power at high switching speeds.

Logic Cell Operation—FIG. 1

Referring to FIG. 1, if the input voltage $V_{in}$ on line 16 is above the threshold level of device Q2, device Q2 and device Q1 are both "on" (that is, "conducting") and the output voltage on line 17 is a logic "0". In the "on" case, the voltage level on line 17 is composed of the "on" voltage of the MOS device Q2 and the "on" voltage of the bipolar device Q1. Both "on" voltages of devices Q1 and Q2 are a function of +Vcc and the conductance of element 14. If the input voltage on line 16 is below the threshold level of device Q2, the output voltage on line 17 is a logic "1" at Vcc and device Q2 and device Q1 are both "off" (that is, "non-conducting").

One important feature of the logic cell 13 is the high speeds at which the cell can be turned "on" and "off" while dissipating low power. The total speed is composed of the "turn on" and "turn off" times of the devices Q1 and Q2 and the propagation delays of the logic cell. High speed is accomplished by two mechanisms. First, the device Q1 is driven in the common-base or common-gate mode, thereby eliminating the Miller effect; and second, the emitter or source of the device Q1 is driven with a field-effect device which exhibits no storage time. In general, biasing element 15 is selected with a value relative to element 14 to insure that device Q1 is saturated when in the "on" state. For example, the impedance value of element 15 is approximately an order of magnitude less than the impedance value of element 14.

Allowing the device Q1 to be turned "off" in the cascode manner described greatly reduces the storage time which device Q1 would normally encounter if Q1 were connected in a standard common-emitter circuit and was switched out of saturation. The storage time for a field-effect (unipolar) device such as Q2 connected in a common-source mode is orders of magnitude less than for a bipolar device connected in a common-emitter mode. The storage time of a unipolar device is much less because there is no recombination time for two different types of carriers (holes and electrons) since only one type of carrier is relied upon.

Logic Cell Performance

Because the cell 13 is not slowed down by the Miller-effect capacitance, $C_m$, the switching speed of cell 13 will be an order of magnitude or more greater than conventional ECL circuits under the same conditions. To a first order approximation, the "turn on/turn off", $T_{on/off}$, time of the cell 13 is described by the following equation:

$$T_{on/off} = (RL)(C_C + C_m) \qquad \text{Eq. (6)}$$

where,
$C_C$ = Collector capacitance of device Q1
$C_m$ = Miller-effect capacitance of device Q1
$R_L$ = Resistance of $Z_1$ element 14
$C_m = \beta(C_C)$
$\beta$ = transistor gain As is indicated by Eq. (6), if the Miller-effect capacitance, $C_m$, is very small or non-existent, the rise/fall times of the logic cell with be equal to the product of the load resistance, $R_L$, times the collector capacitance, $C_C$.

Typical transistor gains, $\beta$, are between 10 to 50 causing Miller-effect capacitance to be 10 to 50 times larger than the collector capacitance. If a typical value of 25 is used for the transistor gain, then the logic cell speed in the present invention will be 25 times faster than an ECL gate having the same load resistance.

When the basic cell 13 of FIG. 1 is operated as a logic cell, the transistor Q2 is switched by the electrostatic field applied at the gate by the input signal on line 16. The speed with which the gate 16 can be switched is a function of the input gate capacitance and the output drain capacitance for a field-effect device. The input capacitance for the gate of a field-effect device can be made very small, for example, less than 5 picofarads. However, the output capacitance at the drain of a field-effect device tends to be more than four times higher than the gate input capacitance. The output capacitance in some circuits will cause adverse speed effects, that is, will slow down the circuit.

In the logic cell of FIG. 1, the adverse speed effects of the high output capacitance from the field-effect device Q2 are nullified by the low equivalent input resistance of the emitter or source of the device Q1, since Q1 is connected in a common-base or common-gate configuration. For example, when the drain of the field-effect transistor Q2 connects to the emitter of a bipolar transistor Q1, it is well known that the equivalent emitter input resistance, $R_e$, as given by the following equation:

$$R_e = [KQ/T]/I_e \qquad \text{Eq. (7)}$$

where,

[KQ/T] = approximately 26 millivolts (room temperature)

$I_e$ = emitter current

If the collector load impedance 14 of FIG. 1 is selected as 100 ohms, then the emitter current, $I_e$, is approximately 50 milliamps at room temperature. Accordingly, the equivalent emitter resistance, $R_e$, is approximately 500 milliohms at room temperature or approximately 0.5 ohms. Even if the output capacitance of the field-effect device Q2 is 100 picofarads, the $R_eC_C$ time constant product is still a very acceptable 50 picoseconds. If six time constants represent the nominal transition time, the transition time would be 300 picoseconds and the circuit would have a bandwidth of approximately 1 GHz.

If the transistor Q1 is a field-effect device connected in a common-gate mode, the input source resistance, $R_s$, is like $R_e$ a small value.

Because the device Q1 is connected in common-base or common-gate mode, the transistor Q2 must be able to switch the full emitter or source current carried by the transistor Q1. The amount of power required to switch the transistor Q2, however, is small since the current into the gate of Q2 is small because Q2 is a field-effect device. The switching voltage into the gate of Q2 is relatively high but the power (product of input gate current and input gate voltage) is low because the input gate current is low. Accordingly, the combination of the voltage-switched transistor Q2 switching the transistor Q1 does not require a great amount of input switching power. As previously indicated, the speed at which the device Q2 can be switched and in turn can switch the device Q1 is also high.

The power which is expended in switching the cell 12 is not great while the speed with which the cell 12 can be switched is great.

This great speed can be utilized directly or can be used in a speed/power trade-off for reduced power consumption. This trade-off is implemented to make the power consumption less by increasing the load resistance, $R_L$, of element 14. The increase reduces the $T_{on/off}$ time but also reduces the power consumed. If the resistance is increased to 1/25th its original value, the power consumption is 25 times less in the example assumed. The typical power consumption of a cell 13 is about 4 milliwatts per cell.

Conversely, the logic cell 13 can be made to operate at speeds 10 times greater than the conventional ECL gate using the same load impedance RL. Accordingly, with the upper frequency of an ECL device being approximately 500 MHz, the present invention can be used to obtain operations at 5 GHz or higher. The only limitation on the upper frequency of operation is the gain-bandwidth product of the individual transistors Q1 and Q2.

Figure 2:
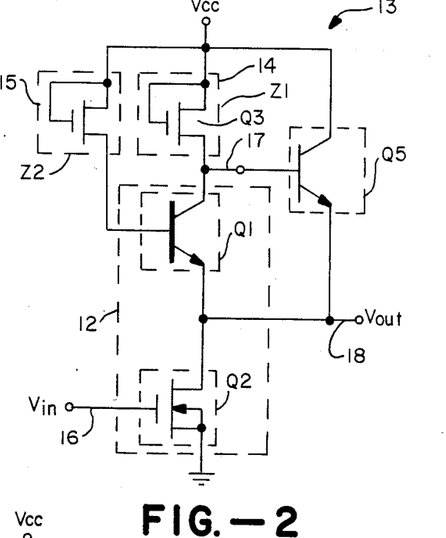
FIG. 2 depicts a typical logic cell embodiment of the basic cell of FIG. 1.

VLSI Logic Cell—FIG. 2

The basic cell 13 of FIG. 1 has been implemented in FIG. 2 for a VLSI (very-large-scale-integration) embodiment. In a typical process, the logic cell 13 can be produced using 3 micron line widths, rendering a three to four thousand cell population on one semiconductor chip. The logic cell of FIG. 2 is composed of five transistors, Q1, Q2, Q3, Q4 and Q5. Two transistors, Q1 and Q5, are bipolar devices, while three devices, Q2, Q3 and Q4 are C-MOS transistors. This structure implies a bipolar/MOS process composed of 12 to 14 mask layers. Alternatively, discrete or hybrid MOS and bipolar devices may be employed. The logic cell 13 is configured for low power dissipation, while producing high speed of operation. Typical propagation delays are in the order of 1 nanosecond or less.

Referring to FIG. 2, if the input level on line 16 is at logic "0", element Q2 is "off". This "off" state cuts off element Q1 and element Q5, the two bipolar devices. With Q1 and Q5 in the "off" mode, the output line 18 is at logic "1". The logic cell of FIG. 2, therefore, inverts the input signal. In addition, if Q1 and Q5 are turned "off", elements Q3 and Q4 will dissipate zero power. Elements Q3 and Q4 are MOS versions of discrete resistors. These MOS devices Q3 and Q4 are embodiments of impedances 14 and 15 in FIG. 1. In VLSI arrangements, discrete resistors are replaced with semiconductors for reduced complexity. Q5 in the cell is an emitter-follower stage designed to provide a low output impedance in order to drive several input gates (not shown) for a large fan-out capability.

Q5 is driven "on" and "off" in a similar manner as Q1 by using the emitter path to rapidly turn "off". Although the cell 13 shows one logic level near zero volts on line 18, the collector of Q1 is one junction, +0.7 volts, above ground due to the base-emitter junction of Q5. In order to insure high speed from the circuit of FIG. 2, it is necessary to have the gain-bandwidth product of Q1 and Q5 be high, for example 3 to 5 GHz. For such gain-bandwidth values, the output capacitance of the transistors Q1 and Q5 typically will be less than 1 picofarad.

One reason why faster turn-off times are accomplished by using the emitter as an input is that opening the emitter diverts the collector current out of the base region. This current "sweep" from the base region eliminates the storage time normally encountered in a common-emitter stage.

Figure 3:
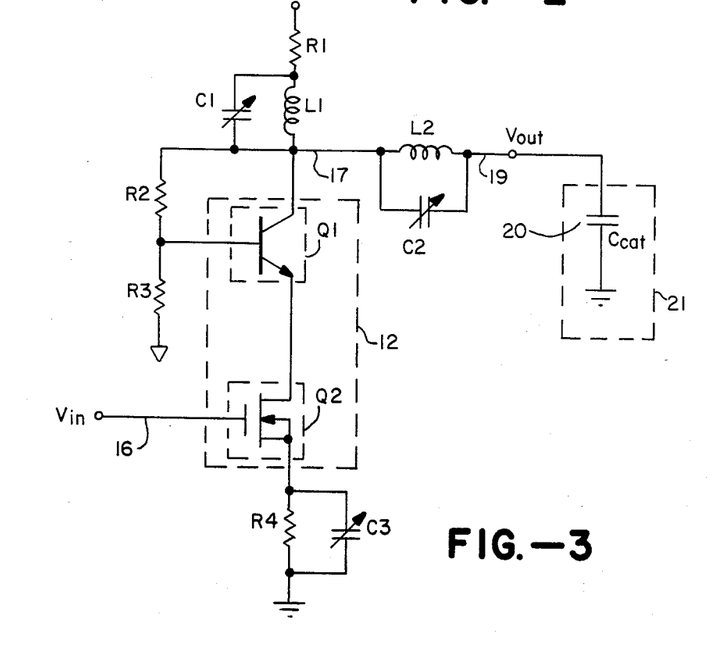
FIG. 3 depicts a linear amplifier embodiment of the basic cell of FIG. 1.

Video Amplifier Cell—FIG. 3

The video amplifier cell of FIG. 3 is a linear embodiment of the logic cell 13 of FIGS. 1 and 2. The significant difference is the ability of the video cell of FIG. 3 to amplify and accurately reproduce a linear input signal, $V_{in}$ on line 16 to form the output signal $V_{out}$ on line 18. FIG. 3 shows the basic video cell composed of four resistors (R1, R2, R3, R4), three capacitors (C1, C2, C3), two inductors (L1, L2), and two transistors (Q1, Q2). Typically, Q1 is a high frequency (gain-bandwidth product of 2 GHz) NPN transistor, while Q2 is high frequency MOS transistor such as a D-MOS transistor. Typically, the D-MOS transistor, Q2, is a lateral device with a gain-bandwidth product of 3 GHz and an input capacitance of 15 picofarads. The FIG. 3 video cell is unique in that it uses a high breakdown voltage MOS transistor, Q2, and a low breakdown voltage high frequency transistor, Q1. As a result of the combination, the video cell has the ability to slew at extremely high rates with extraordinarily high voltage compliance.

The video cell of the FIG. 3 type is used, in one typical application, to drive the cathode of a color CRT in a high resolution graphics application. The cathode capacitance of a color CRT is typically 14 picofarads. Design specifications of 180 MHz video bandwidth at 25 Volts peak-to-peak with rise/fall times of 1.9 nonseconds are desirable.

In the amplifier cell of FIG. 3, the output power deliverable on line 19 is limited by the current ratings of the transistors Q1 and Q2. In order to increase the output power capability, the Q1 and Q2 transistors can be grouped in parallel as shown in the following FIG. 4.

Figures 4, 5:
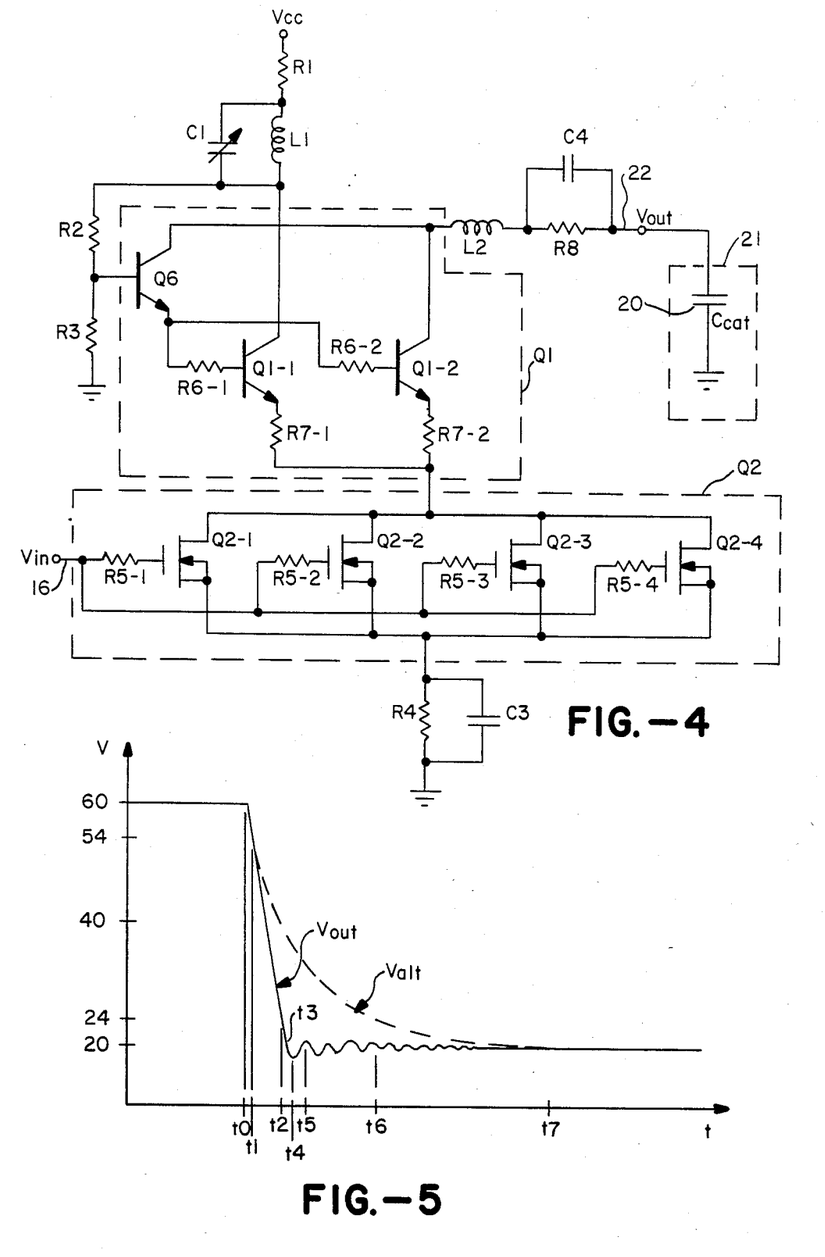
FIG. 4 depicts a high-bandwidth, large-breakdown voltage linear amplifier suitable for amplifying video signals for a cathode ray tube.
FIG. 5 depicts a waveform which represents the operation of the FIG. 4 amplifier.

High-Power Video Amplifier—FIG. 4

In FIG. 4, a high-power video amplifier is shown in further detail. The amplifier includes a first bank of Q1 transistors including transistors Q1-1 and Q1-2. Transistors Q1-1 and Q1-2 are connected in a common-base mode in a Darlington connection with the transistor Q6. The base of the transistor Q6 is tied between the resistors R2 and R3. Resistor R3 is connected to ground and resistor R2 is connected through the L1/C1 circuit to resistor R1 which is in turn connected to $V_{cc}$.

The base resistors R6-1 and R6-2 are provided to suppress spurious oscillations which typically can be present in high-frequency devices. The load resistors R7-1 and R7-2 are current-sharing resistors. The inductors L1 and L2 are standard shunt-peaking devices which maximize the rise/fall times in the circuit. The capacitors C1 are used to accurately control the overshoot and undershoot of the pulse response.

In FIG. 4, the MOS Q2 device includes 4 MOS transistors Q2-1, Q2-2, Q2-3 and Q2-4. The gates of the transistors Q2-1 through Q2-4 are each connected with a gate resistor R5-1 through R5-4, respectively. The resistors R5-1 through R5-4 are used to suppress spurious oscillations in the same way as the resistors R6-1 and R6-2. Each of the resistors connects between a corresponding gate and the $V_{in}$ signal on line 16.

The FIG. 4 amplifier differs from the FIG. 3 amplifier by the inclusion of the output resistor R8 and the parallel capacitor C4. The resistor R8 is selected to protect the amplifier of FIG. 4 from high voltages on the load resulting when arcing conditions occur. The capacitor C4 is selected to maximize the frequency response and attempt to nullify the presence of the resistor R8.

In operation, the input voltage, $V_{in}$, has a +2 volt DC bias and has a 3 volt range between 2 volts and 5 volts. The output voltage $V_{out}$ on line 22 has an output of 60 volts down to 20 volts as a direct function of the input voltage, $V_{in}$. The circuit of FIG. 4 is capable of driving in excess of 10 watts and the output can follow the input with 1.9 nanosecond rise and fall times.

Typical values of the components in FIG. 4 (also applicable where present to FIG. 3) are given by the following TABLE 1.

TABLE 1

| | |
|---|---|
| R1 | 100 ohms |
| R2 | 510 |
| R3 | 1200 |
| R4 | 10 |
| R5-1, ..., R5-4 | 20 |
| R6-1, R6-2 | 20 |
| R7-1, R7-2 | 10 |
| R8 | 220 |
| C1 | 2-5 picofarads |
| C2 (FIG. 3 only) | 150 |
| C3 | 51 |
| C4 | 150 |
| $C_{cat}$ | 8-10 |
| L1 | 0.5 microhenry |
| L2 | 0.5 |
| $V_{cc}$ | 65 volts |

Amplifier Operation—FIG. 5

In FIG. 5, a waveform representative of the operation of the FIG. 4 amplifier circuit is shown. The vertical axis represents voltage, V, and the horizontal axis represents time, t. Prior to time t0, the input voltage, $V_{in}$, is at 2 volts and the output voltage is at 60 volts. At time t0, the input voltage is switched to 5 volts, assuming a step-pulse input with essentially no risetime. The output voltage, $V_{out}$ begins to switch from 60 volts toward 20 volts. At time t1, the output voltage, $V_{out}$, has switched from 60 volts to the 10% level of 54 volts. At time t2, $V_{out}$ has switched to 24 volts. At t3, $V_{out}$ crosses the 20 volt level and undershoots to approximately 19 volts. At 19 volts, the output reverses direction until it returns almost to 21 volts at t5. $V_{out}$ continues to ring with reduced amplitude until at some time later at t7 it finally settles to 20 volts. The period of time between the 10% voltage levels of 54 volts and 24 volts, that is, the time between t1 and t2, is approximately 1.9 nanoseconds. This very fast falltime is achieved in part by use of the RC and LC circuits in FIG. 4. Without these circuits, the falltime from 60 to 20 volts would be several times greater than the 1.9 nanoseconds as shown by $V_{alt}$. In FIG. 5, $V_{alt}$, that is the alternative output, would have a falltime, between 54 volts and 24 volts, from t1 to t4 of approximately 5 nanoseconds.

The FIG. 5 waveform represents an input voltage transition from 2 to 5 volts. The operation with an input transition from 5 to 2 volts would be essentially the same except that the voltage levels would be reversed. Of course, under normal operation, $V_{in}$ has values which range between 2 and 5 volts and $V_{out}$ has values which range proportionately between 60 and 20 volts.

Figures 6, 7:
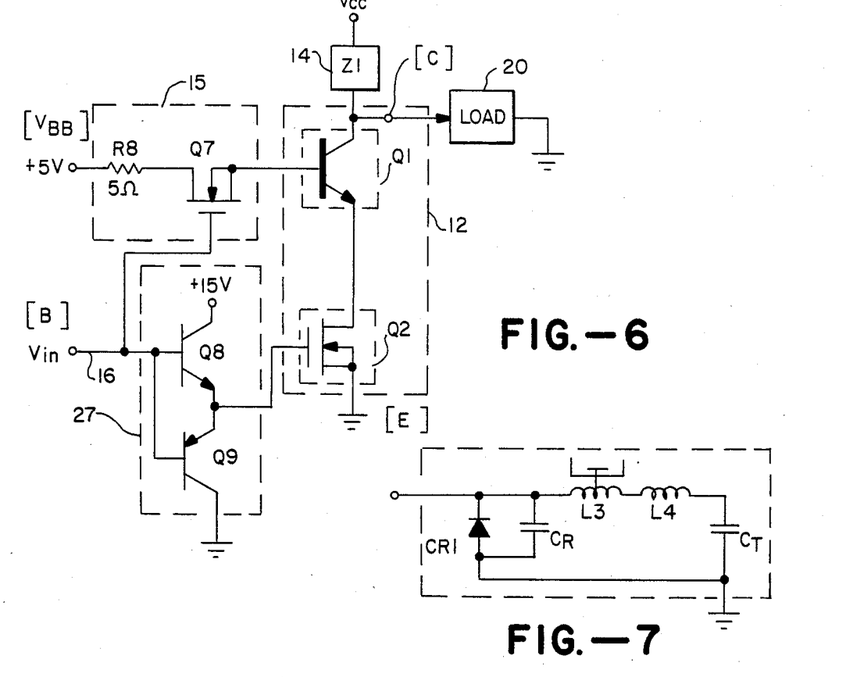
FIG. 6 depicts a high-voltage, high-current embodiment of the basic cell of FIG. 1.
FIG. 7 depicts a waveform representative of the operation of the FIG. 7 circuit.

Power Amplifier—FIG. 6

In FIG. 6, basic cell 12 of FIG. 1 is shown in a high-voltage, high-current, high-power embodiment. The amplifier of FIG. 6 can be used in many applications. In some applications, the low impedance driver, including transistors Q8 and Q9, may not be required. When not required, the input on line 16, $V_{in}$, connects directly to the gate of Q2. In some applications, the element 14 represents the load and the load 26 is eliminated. The element 14 can be a complex or purely resistive load. A hybrid embodiment of a four terminal device (formed by the combination of biasing circuit 15 and basic cell 12) is of great utility and can be used, for example, in the power supply field. The hybrid package has three leads together with the case which functions as the fourth lead. The fourth lead is connected to the collector. The four leads are designated as "C" (for collector), "+$V_{BB}$" (for supply), "B" (for base), and "E" (for emitter). The hybrid circuit functions as a power transistor with the specifications set forth in TABLE 2:

TABLE 2

| ITEM | SYMBOL | UNIT |
|---|---|---|
| 1. Collector-to-base voltage | $V_{CBO}$ | 1500 Volts |
| 2. Collector-to-emitter voltage | $V_{CEO}$ | 1500 Volts |
| 3. Emitter-to-base voltage | $V_{EBO}$ | +20 Volts |
| 4. Collector current | IC | 8 Amps |
| 5. Collector peak current | IC (PEAK) | 10 Amps |
| 6. Collector surge current | IC (SURGE) | 16 Amps |
| 7. Total power dissipation | PC | 100 Watts |
| 8. Junction temperature | TJ | 150 C. |
| 9. Fall time IC = 5A | TF | 150 NS |
| 10. Storage time IC = 5A | TSTG | 150 NS |
| 11. Collector-to-emitter saturation voltage | $V_{CE}$(SAT) | 4.0 Volts |

TABLE 2-continued

| ITEM | SYMBOL | UNIT |
| --- | --- | --- |
| IC = 5A | | |

As indicated in TABLE 2, the circuit has a high voltage handling capability of +1,500 volts with 10 amps peak current.

The power amplifier of FIG. 6 typically is used in the horizontal deflection circuit of FIG. 7 which is part of a color CRT raster-scan video monitor for high resolution graphics. The power amplifier of FIG. 6 readily meets the fast switching requirements of a high resolution monitor. In one application, a monitor has a 1280×1024 non-interlaced column-by-row scan configuration operating at horizontal scan rate of 64 KHz. The scan period including retrace time is 15.6 microseconds with a retrace time of 2.5 microseconds. The retrace period is the time allotted for the horizontal scan current to change from a positive peak current to a negative peak current.

The power amplifier of FIG. 6 together with the load of FIG. 7 are designed to meet high-performance requirements. In a monitor, the fast reversal of scan current causes a large flyback voltage across the switching transistor. The magnitude of the flyback voltage is a function of the deflection yoke inductance, L4, and the retrace time, $T_R$.

The FIG. 6 and FIG. 7 circuit is a shunt-driven energy recovery circuit which uses the basic cell 12 which includes transistors Q1 and Q2. The FIG. 6 circuit, in a high-performance embodiment, also includes the transistors Q8 and Q9 as low-impedance drivers to drive the high-input capacitance of a V-MOS transistor Q2. In one embodiment, transistor Q1 is a high voltage ($B_VC_{VO}$ typically +1700 volts), high current (5 amps) power transistor. The elements Z1, L3, L4, CR1, $C_R$ and $C_T$ are standard components employed for energy recovery. $C_R$ (typically 3300 picofards) is a retrace capacitor, while $C_T$ (typically 1 microfarad) is a trace capacitor. L3 (adjustable typically from 5 to 20 microhenry) is a saturable inductor used to linearize the scan current because of standard circuit losses in the form of heat dissipation. CR1 is a damper diode, while Z1 is a power isolation inductor (typically 2000 microhenry). Inductor L4 is the yoke and is typically 180 microhenry.

Figure 8:
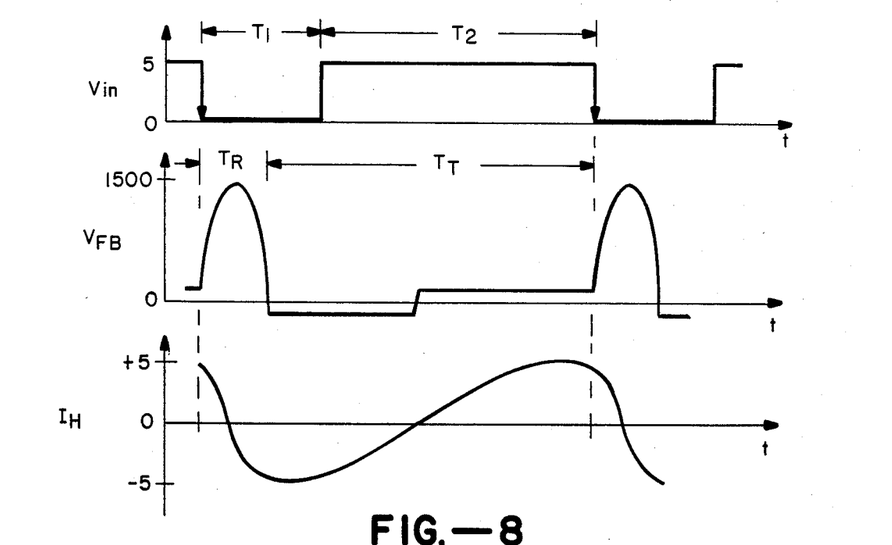

Horizontal Deflection Operation—FIGS. 6, 7, and 8

The voltage and current waveforms which represent the FIGS. 6 and 7 circuit operation are shown in FIG. 8. The horizontal scan current, $I_H$, and the flyback voltage pulse, $V_{FP}$, generated during the retrace period are shown. The flyback pulse, $V_{FP}$, appears at the collector of Q1, the bipolar transistor. The scan current, $I_H$, is the current through the deflection yoke indicated by L4.

The $V_{in}$ signal drives the V-MOS device and is shown as a rectangular wave at 0 or 5 volts with a duty cycle of ⅓ "off" during T1 and ⅔ "on" during T2. T1 is typically 5 microseconds while T2 is typically 10.6 microseconds for a total period of 15.6 microseconds.

The horizontal deflection circuit of FIGS. 6 and 7 operates as an electronic flywheel synchronized by the negative-going transition of input signal $V_{in}$. The circuit is a resonant system composed of two resonant circuits having two resonant frequencies. During the trace period, $T_T$, the circuit resonance is determined by the total inductance, L3 plus L4, and the trace capacitor, $C_T$.

During the retrace period, $T_R$, the resonant frequency is determined by the sum, L, of L2 plus L3, and by $C_R$, the retrace capacitor. The retrace resonant frequency, $RF_R$, is given by the following equation:

$$RF_R = 1/[2\pi(LC_R)^{\frac{1}{2}}] \qquad \text{Eq. (8)}$$

In a similar manner the trace resonant frequency, $RF_T$, is given by the following equation:

$$RF_T = 1/[2\pi(LC_T)^{\frac{1}{2}}] \qquad \text{Eq. (9)}$$

Referring to FIG. 8, it is apparent that the duration T1 of the signal $V_{in}$ does not control the flyback time $T_R$. Rather the duration of $T_R$ is controlled as indicated in Eq. (8) above. In a similar manner, the trace period, $T_T$ is not controlled by the input signal $V_{in}$ but rather is controlled as indicated above in connection with Eq. (9). For this reason, the flyback period $T_R$ can be made very small thus permitting very high frequencies of operation at high power.

The operation of the FIG. 6 circuit is to synchronize the two resonant circuits in the load 26 by the operation of the negative-going transition of the input signal $V_{in}$. Additionally, the transistors Q1, Q2 insert energy into the resonant circuits to compensate for the loss of energy due to heat and other factors. The transistor Q1 is switched very rapidly through its emitter by the operation of the Q2 transistor in the same manner as in the other embodiments of the present invention. Additionally, the biasing circuit 15 including the transistor Q7 helps to drive the transistor Q1 in the high-power application of the present invention.

While the invention has been particularly shown and described with reference to preferred embodiments thereof, it will be understood by those skilled in the art that various changes in form and details may be made therein without departing from the spirit and scope of the invention.

What is claimed is:

1. A high-speed circuit having a circuit input and a circuit output comprising,
    a first device including a high-speed transistor having an input region, an output region forming the circuit output and a control region, said first device having a high gain-bandwidth product,
    biasing means connected to said control region for controlling the operating point of said first device in a mode whereby Miller-effect capacitance is minimized,
    a second device including a unipolar transistor having a gate forming the circuit input, a source and a drain, said second device having a high gain-bandwidth product, said drain connected to the input region of said first device, said gate adapted to receive an input signal for controlling the drain current and thereby the current supplied to the input region of said first device whereby the output signal from the output region of said first device is controlled at high speed.

2. The high-speed circuit of claim 1 wherein said first device is a bipolar transistor and said input region is the emitter, said output region is the collector and said control region is the base and wherein said biasing means connects said first device in a common-base mode.

3. The high-speed circuit of claim 1 wherein said first device is a unipolar transistor and said input region is the source, said output region is the drain and said control region is the gate and wherein said biasing means connects said first device in a common-gate mode.

4. The circuit of claim 3 wherein said biasing means maintains said first device in the linear region whereby said circuit output signal is a linear amplification of said circuit input signal.

5. The circuit of claim 1 wherein said biasing means drives said first device "on" when said second device is "on" and drives said first device "off" when said second device is "off".

6. The circuit of claim 5 wherein said biasing means drives said first device into saturation when "on".

7. The circuit of claim 5 wherein said biasing means includes a first element having a first impedance connected between said output region and a reference voltage level and including a second element having a second impedance connected between said reference voltage and said control region and where said second impedance is much less than said first impedance.

8. The circuit of claim 1 wherein said first device and said second device each have a gain-bandwidth product greater than 8 GHz.

9. The circuit of claim 1 wherein said biasing means includes first RLC circuit components connected between a first reference voltage level and said output region and includes second circuit components connected between said output region and said control region to bias said first device in the linear region.

10. The circuit of claim 9 including LC circuit components connected to said output region to provide said output signal.

11. The circuit of claim 9 including RC circuit components connected between said source and a second reference voltage level.

12. The circuit of claim 1 wherein said first device includes a plurality of high-speed transistors each having an input region, an output region and a control region, each of said high-speed transistors having a high gain-bandwidth product, and said first device including means for connecting the input regions in common and including means for connecting the output regions in common and means for connecting the control regions in common whereby said high-speed transistors operate in parallel to provide said output signal, and wherein said second device includes a plurality of unipolar transistors each having a gate, a source and a drain and each having a high gain-bandwidth product, said second device having means for connecting said sources in common, having means for connecting said drains in common, and having means for connecting said gates in common to receive said circuit input signal.

13. The circuit of claim 12 wherein the transistors in said first device and in said second device each have a gain-bandwidth product greater than 2 GHz.

14. The circuit of claim 12 wherein said biasing means includes first RLC circuit components connected between a first reference voltage level and said output region and includes second circuit components connected between said output region and said control region to bias said first device in the linear region.

15. The circuit of claim 14 including LC circuit components connected to said output region to provide said output signal.

16. The circuit of claim 15 including RC circuit components connected between said source and a second reference voltage level.

17. The circuit of claim 14 including RLC circuit components including an output resistor connected to said output regions of said high-speed transistors to provide said output signal whereby high voltage spikes in an output load are suppressed by said output resistor.

18. The circuit of claim 17 wherein said biasing means includes a field-effect device connected to drive said control region, said field-effect device connected to receive said input signal.

19. The circuit of claim 1 wherein the first device is a power transistor for driving a load having resonant circuits including a first resonant circuit having a total inductant L and a trace capacitor $C_T$ and including a second resonant circuit having said inductant L and a retrace capacitance $C_R$ and wherein said high-speed circuit synchronizes the operation of said resonant circuits.

20. A high-speed power circuit having a circuit input and having a circuit output for driving a load having resonant circuits comprising,
a first device including a high-speed power transistor having an input region, an output region forming the circuit output and a control region,
biasing means connected to said control region for controlling the operating point of said first device in a mode whereby Miller-effect capacitance is minimized,
a second device including a unipolar transistor having a gate forming the circuit input, a source and a drain, said drain connected to the input region of said first device, said gate adapted to receive an input signal for controlling the drain current and thereby the current supplied to the input region of said first device whereby the output signal from the output region of said first device is controlled at high speed; said output signal connected to synchronize said resonant circuit in said load.

* * * * *